(12) United States Patent
Lundstrum et al.

(10) Patent No.: US 8,373,357 B2
(45) Date of Patent: Feb. 12, 2013

(54) MODULATOR MODULE IN AN INTEGRATED CIRCUIT DEVICE

(75) Inventors: Zeke R. Lundstrum, Chandler, AZ (US); Keith Curtis, Gilbert, AZ (US); Sean Steedman, Phoenix, AZ (US); Vivien Delport, Chandler, AZ (US); Jerrold S. Zdenek, Maricopa, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 561 days.

(21) Appl. No.: 12/690,258

(22) Filed: Jan. 20, 2010

(65) Prior Publication Data
US 2010/0188014 A1 Jul. 29, 2010

Related U.S. Application Data

(60) Provisional application No. 61/147,137, filed on Jan. 26, 2009.

(51) Int. Cl.
*H05B 37/02* (2006.01)
*H03C 3/00* (2006.01)

(52) U.S. Cl. ........ 315/291; 315/308; 332/101; 332/104; 327/355; 327/407

(58) Field of Classification Search .............. 315/209 R, 315/224, 227 R, 291, 307, 308; 327/99, 327/355, 356, 407, 408; 332/101–104, 155, 332/157, 183, 185
See application file for complete search history.

(56) References Cited

U.S. PATENT DOCUMENTS

| | | | | |
|---|---|---|---|---|
| 3,697,892 A | 10/1972 | Lawrence et al. | ............. | 332/9 R |
| 4,551,846 A | 11/1985 | Takeda et al. | .................... | 375/82 |
| 5,311,556 A | 5/1994 | Baker | ............................. | 375/88 |
| 5,818,867 A * | 10/1998 | Rasmussen et al. | .......... | 375/146 |
| 6,841,983 B2 * | 1/2005 | Thomas | ........................ | 323/322 |
| 7,456,587 B2 * | 11/2008 | Lin | ................................ | 315/291 |

OTHER PUBLICATIONS

International PCT Search Report and Written Opinion, PCT/US2010/021915, 10 pages, Mailed Jan. 25, 2010.

* cited by examiner

*Primary Examiner* — Jimmy Vu
(74) *Attorney, Agent, or Firm* — King & Spalding L.L.P.

(57) ABSTRACT

An integrated circuit device has a modulator module that provides a modulation signal comprising one frequency keyed on and off, or alternating between two or more different frequencies or phases that are selected based upon a modulator signal. The one or more frequencies or phases may be selected from a plurality of frequency sources. Switching the one frequency on or off, or between the at least two different frequencies or phases may be synchronized with one or both of the two or more different frequencies or phases so that "glitches" or spurs are not introduced into the modulation signal. The integrated circuit device may also comprise a processor, memory, digital logic and input-output. Frequency sources may be internal to the digital device or external. The modulator signal may comprise serial data generated from the digital logic and/or processor of the digital device.

28 Claims, 8 Drawing Sheets

MODULATOR MODULE IN AN INTEGRATED CIRCUIT DEVICE

RELATED PATENT APPLICATION

This application claims priority to commonly owned U.S. Provisional Patent Application Ser. No. 61/147,137; filed Jan. 26, 2009; entitled "Modulator Module in an Integrated Circuit Device," by Keith Curtis, Sean Steedman, Jerrold S. Zdenek and Zeke R. Lundstrum; and is hereby incorporated by reference herein for all purposes.

TECHNICAL FIELD

The present disclosure relates to integrated circuit devices, and, more particularly, to integrated circuit devices having a modulation module integral therein.

BACKGROUND

Electronic systems, such as wireless systems, may communicate by some form of electromagnetic signals, e.g., radio frequency, infrared, etc. Also there are many types of modulation that may be used for the electromagnetic signals, e.g., amplitude modulation (AM), frequency modulation (FM), phase shift keying (PSK), frequency shift keying (FSK), etc. Present technology only offers an application specific communications modulator peripheral that must be added to the other electronic logic of the wireless electronic systems. This requires additional printed circuit board real estate and a separate integrated circuit device package for a communications modulator peripheral.

In addition, there are other electronic devices that may be wired or wireless, and require modulated signals for communications and/or control of an application, e.g., motor speed and fluorescent lamp dimming control, that use a plurality of different frequencies that may be modulated between the plurality of different frequencies and/or on and off keying of any one or more of the plurality of different frequencies.

SUMMARY

What is needed is an integrated circuit device that includes a communications modulator peripheral, and provides an interface to manipulate and automate the circuitry of that communications modulator peripheral with digital logic that also is included in the integrated circuit device. The communications modulator peripheral is capable of generating substantially any form of modulation using binary data, and may generate a data modulated signal from data supplied by the digital logic of the integrated circuit device, without requiring external connections or external peripheral devices.

For example, data transmissions may use audio modems, ultrasonic, infrared (IR) and radio frequency signal devices that use an appropriate modulated carrier to send the data. Operating frequencies of the modulated carrier may be, for example but are not limited to, as low as 40 Hz and as high as 32 Mhz. Heretofore, modulating a carrier signal has typically required external circuitry apart from the integrated circuit device, e.g., microcontroller.

Different types of modulation formats may be supported, according to the teachings of this disclosure. Some of these modulation formats supported may be, for example but are not limited to, on-off keying (OOK), frequency shift keying (FSK), phase shift keying (PSK) pulse width modulation (PWM), pulse position modulation (PPM), pulse density modulation (PDM), etc.

Modulation logic is integral with the integrated circuit device and may use internal frequency sources for the carrier(s) and modulation data from the integrated circuit device internal hardware logic, modulation data that is software generated, or modulation data from an external data source(s). Modulation between ones and zeros of the data modulation transitions of the selected carrier may be synchronized automatically so as to substantially reduce "glitches" and/or other unwanted frequency content, e.g., spurious noise, in the modulated signal output. For example when synchronization is enabled, when the modulator signal switches from logic low to high or high to low (e.g., logic transitions) will the carrier sources be switched. Synchronization ensures that the current carrier signal goes to a logic low or high before switching to the logic low or high, respectively, of a different carrier signal. This feature prevents shortened carrier pulses from appearing at bit boundaries in the output signal.

Carrier sources may be, for example but are not limited to, 1) a system clock of the integrated circuit device having an independent frequency divider, 2) a plurality of pulse width modulation (PWM) and/or Pulse Position Modulation (PPM) channels capable of operating at multiple frequencies and having offset timers with a common period that enables multiple phases, 3) an external clock source(s) and 4) a plurality of pulse density modulation (PDM) channels having a fixed duty cycle and capable of operating at different numbers of pulses per time period.

Modulation sources may be, for example but are not limited to, 1) Master Synchronous Serial Port/Synchronous Serial Port (MSSP/SSP), e.g., Serial Peripheral Interface Bus (SPI) and Inter-Integrated Circuit ($I^2C$) communications peripherals; 2) Universal Asynchronous Receiver Transmitter (UART), including Universal Synchronous Asynchronous Receiver Transmitter (USART) and Enhanced Asynchronous Receiver Transmitter (EUART) that may be used for non-return to zero (NRZ) data streams; 3) software bit for software program controlled modulation peripherals, 4) PWM module for pulse width and pulse position modulation, 5) voltage comparators for process control applications, and 6) External signals.

It is contemplated and within the scope of this disclosure that two or more carrier sources, selectable by the modulation source(s) may be at the same frequency but in different phase relationships, e.g., shifted in phase by 120 electrical degrees to drive and control three phase brushless direct current motors.

According to a specific example embodiment of this disclosure, an integrated circuit device having a modulation module comprising: a modulation mixer; a modulator multiplexer having inputs that receive a plurality of modulator signals and an output connected to a modulator input of the modulation mixer, wherein the modulator multiplexer selects a one of the plurality of modulator signals for coupling to the modulator input; a high carrier multiplexer having inputs adapted for coupling to a plurality of carrier signals and an output coupled to a high carrier input of the modulation mixer, wherein the modulator multiplexer selects which one of the plurality of carrier signals is coupled to the high carrier input; a low carrier multiplexer having inputs adapted for coupling to the plurality of carrier signals and an output coupled to a low carrier input of the modulation mixer, wherein the modulator multiplexer selects which one of the plurality of carrier signals is coupled to the low carrier input; and wherein the modulation mixer outputs a modulated signal derived from the high carrier input when the modulator input is at a first logic level and from the low carrier input when the modulator input is at a second logic level.

BRIEF DESCRIPTION OF THE DRAWINGS

A more complete understanding of the present disclosure thereof may be acquired by referring to the following description taken in conjunction with the accompanying drawings wherein.

Figure 1:
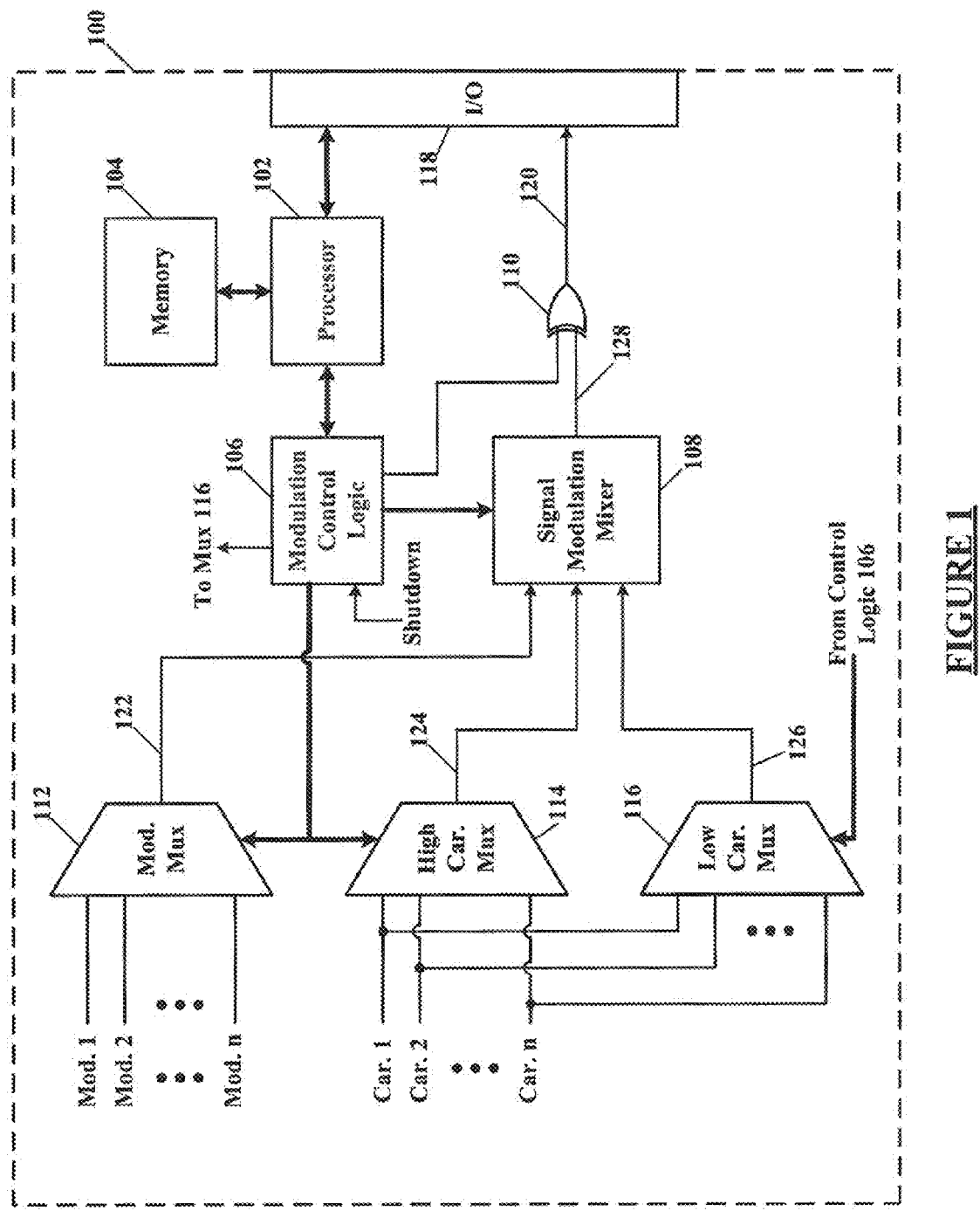
FIG. 1 illustrates a schematic block diagram of an integrated circuit device comprising a modulator module, according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawing, the details of specific example embodiments are schematically illustrated. Like elements in the drawings will be represented by like numbers, and similar elements will be represented by like numbers with a different lower case letter suffix.

Referring to FIG. 1, depicted is a schematic block diagram of an integrated circuit device comprising a modulator module, according to a specific example embodiment of this disclosure. An integrated circuit device, generally represented by the numeral 100, comprises a modulator module having modulation control logic 106, a signal modulation mixer 108, an XOR gate 110, a modulator multiplexer 112, a high carrier multiplexer 114, a low carrier multiplexer 116, and input receivers and output drivers (I/O) 118. The integrated circuit device 100 may further comprise a digital processor 102 and a memory 104. The integrated circuit device 100 may be, for example but is not limited to, a microcontroller, a microprocessor, a digital signal processor (DSP), an application specific integrated circuit (ASIC), a programmable logic array (PLA), a field-programmable gate array (FPGA), etc. Generally, the digital processor 102 is controlled with a software/firmware program stored in the memory 104. The memory 104 may be volatile and/or nonvolatile random access memory (RAM), and the like.

The function of the modulation control logic 106 may be performed by the digital processor 102 controlled by a software program (not shown), and/or dedicated hardware/firmware logic specifically designed to operate the multiplexers 112, 114 and 116, according to the teachings of this disclosure. The modulation control logic 106 may be may be, for example but is not limited to, a state machine. The XOR gate 110 may be used to invert the polarity of the modulated signal 128 coming from the signal modulation mixer 108. The modulation control logic 106 may have a shutdown control input for shutting down the modulator module when not used or when the integrated circuit device is in a standby or sleep mode. When the modulation control logic 106 is shutdown its output may also be put into a high impedance state, e.g., tri-state output.

Any one of a plurality of modulation signals may be selected at any time through the modulator multiplexer 112. Any two of a plurality of carrier signals may be selected at any time through the high carrier multiplexer 114 and low carrier multiplexer 116, respectively. This feature enables having a plurality of different frequency pulses in a pulse stream, e.g., for fluorescent lamp drive and dimming applications, light emitting diode (LED) brightness control applications, brushless direct current motor drive and control applications, etc.

The modulator module provides the capability of generating a modulated signal 128 and sending this signal 128 through the I/O 118 of the integrated circuit device 100 without requiring external modulator and driver circuits.

Figure 2:
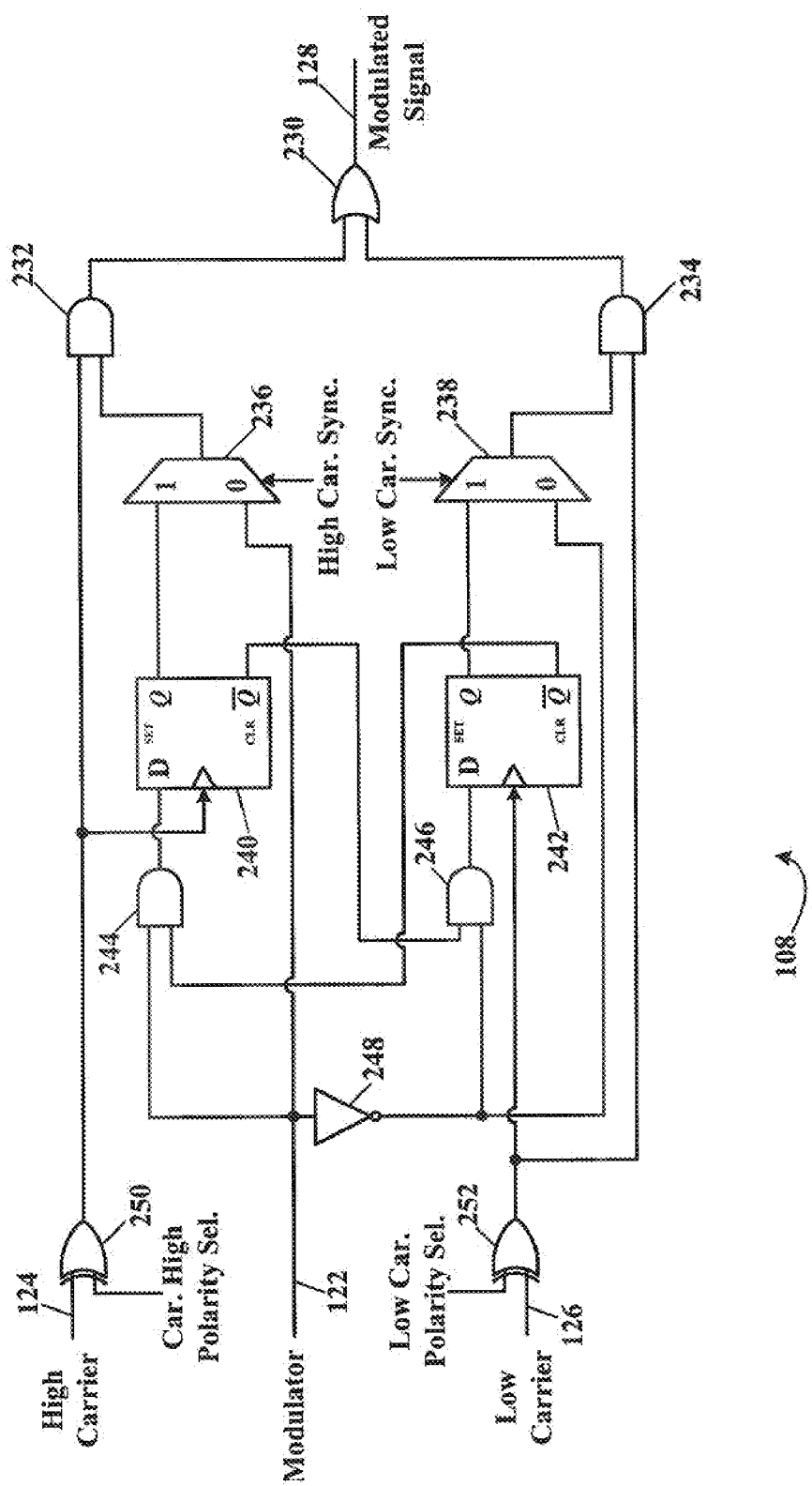
FIG. 2 illustrates a schematic diagram of a mixer in the modulator module of the integrated circuit device shown in FIG. 1, according to a specific example embodiment of this disclosure.

Referring to FIG. 2, depicted is a schematic diagram of a mixer in the modulator module of the integrated circuit device shown in FIG. 1, according to a specific example embodiment of this disclosure. The high and/or low carriers may be from internal clocks, clocks and frequency dividers, timers, external, etc. The signal modulation mixer 108 takes the incoming modulator signal from the output 122 of the modulator multiplexer 112 which is ANDed with a carrier signal from either the high carrier 124 from the high carrier multiplexer 114 or the low carrier 126 from the low carrier multiplexer 116 to create the modulated signal 128.

Modulator sources may be from internal data signal sources and/or external data signal sources (not shown). Any one of a plurality of modulator sources may be selected through the modulator multiplexer 112. The selected modulator source is a data stream that will modulate one or two carriers, i.e., high carrier 124 or low carrier 126 (sequentially in time). In addition, the high carrier multiplexer 114 and/or the low carrier multiplexer 116 may be used to select more then one high carrier output 124, and/or low carrier output 126, respectively, so that a plurality of high and/or low carriers may be in the data stream sequentially. This feature is most advantageous for brightness control of fluorescent lamps having heated filaments, and speed control of brushless direct current motors.

A unique feature of the signal modulation mixer 108 is carrier synchronization which insures that substantially no glitches occur in the modulated signal 128. Glitches or shortened carrier pulses are caused by the modulator switching from one carrier frequency to another. When carrier switching synchronization is enabled and the modulator data switches logic levels, e.g., from a logic high to a logic low or visa versa, the modulation mixer 108 first waits for the current carrier to go to a logic low. That carrier output is then latched low enabling the output of the data low carrier. Once a falling edge is detected on the data low carrier, output is enabled for that carrier source.

The carrier switching synchronization may be accomplished when a logic high is applied to the high carrier synchronization control port of the multiplexer 236, and/or the low carrier synchronization control port of the multiplexer 238. The D-flip-flops 240 and 242 retain the logic levels of the high carrier 124 and the low carrier 126, respectively. So that whenever there is a logic level change in the modulator signal 122 and one or both of the carrier synchronization control ports is at a logic high, switching between the high carrier and the low carrier, or visa versa, will occur as more fully described hereinafter. The high and low carrier logic levels may be reversed through the XOR gates 250 and 252, respectively. It is contemplated and within the scope of this disclosure that other logic circuit designs may be utilized for the functions of the circuit shown in FIG. 1, and would be readily apparent to one having ordinary skill in digital logic design and having the knowledge of the teachings of this disclosure.

Figure 3:
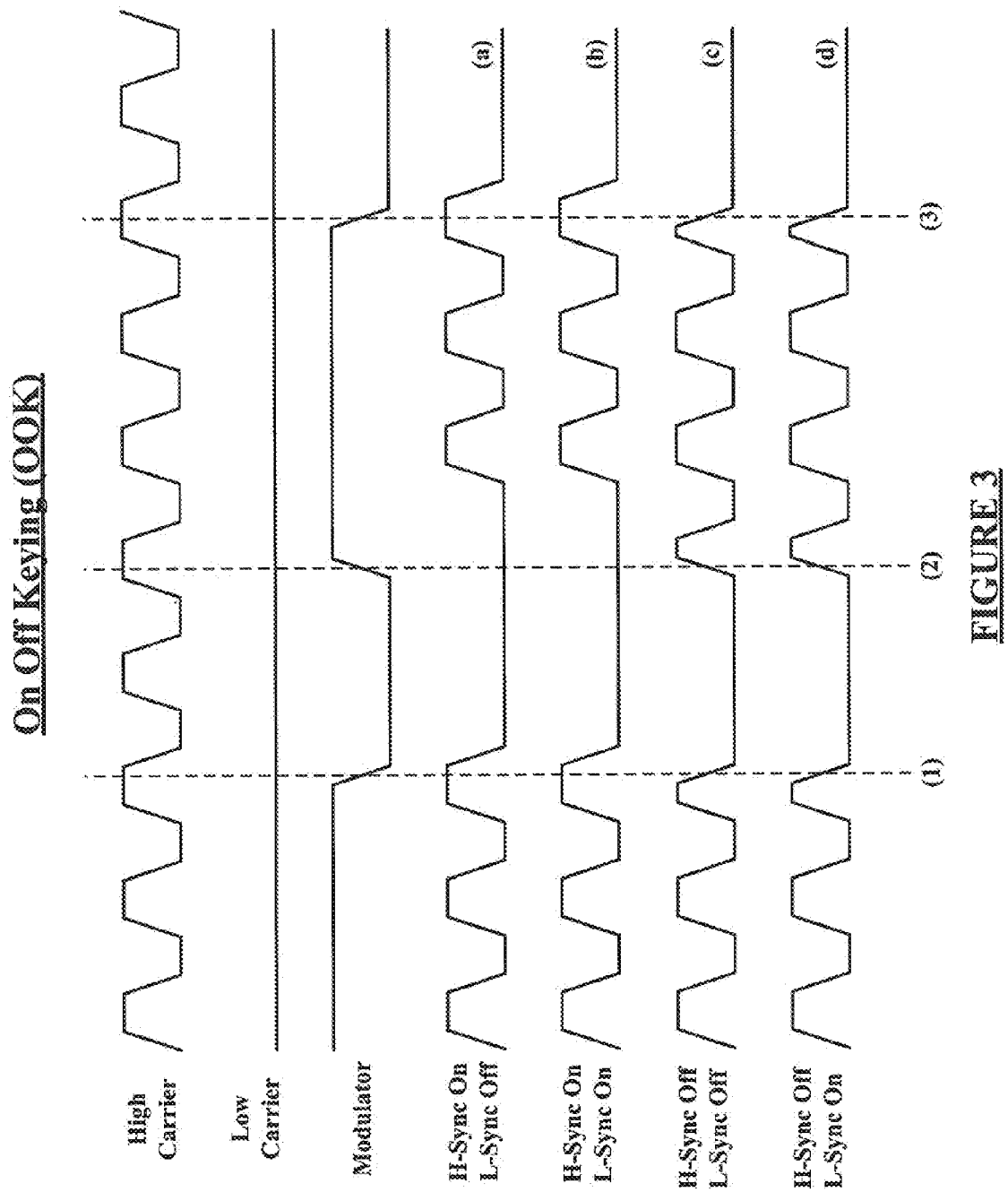
FIG. 3 illustrates a schematic timing diagram of an on and off keying (OOK) modulated signal, according to the teachings of this disclosure.

Referring to FIG. 3, depicted is a schematic timing diagram of an on and off keying (OOK) modulated signal, according to the teachings of this disclosure. The modulator signal 122 causes the signal modulation mixer 108 to switch between the high carrier signal 124 and the low carrier signal 126. In the example shown in FIG. 3 the low carrier signal 126 is at a logic low continuously, i.e., off. Whenever the modulator signal 122 is at a logic high, the signal modulation mixer 108 will use the high carrier signal 124, and whenever the modulator signal 122 is at a logic low, the signal modulation mixer 108 will use the low carrier signal 126. How enabling and/or disabling synchronization for the high and low carriers affects the modulated signal 128 are illustrated in the four lower waveform graphs (a)-(d).

Referring now to waveform graph (a), high carrier synchronization is enabled and low carrier synchronization is disabled. Whenever the modulator signal 122 goes to logic low and the high carrier signal 124 goes to logic low, the modulated signal 128 will go to logic low. Thus, the transition from the high carrier signal 124 to the low carrier signal 126 will be synchronized with the logic level change (from high to low) of the high carrier signal 124.

Referring now to waveform graph (b), both high carrier and low carrier synchronizations are enabled. Whenever the modulator signal 122 goes to logic low and the high carrier signal 124 goes to logic low, the modulated signal 128 will go to logic low. Thus, the transitions between the high carrier signal 124 and the low carrier signal 126 will be synchronized with a logic level change from high to low. In this example, the low carrier signal 126 is always at a logic low so the modulated signal 128 is the same as in waveform graph (a).

Referring now to waveform graph (c), both high carrier and low carrier synchronizations are disabled. Whenever the modulator signal 122 goes to logic low the modulated signal 128 will go to logic low. The transition from the high carrier signal 124 to the low carrier signal 126 may be truncated as illustrated at time points (1), (2) and (3).

Referring now to waveform graph (d), high carrier synchronization is disabled and low carrier synchronization is enabled. Whenever the modulator signal 122 goes to logic low the modulated signal 128 will go to logic low. The transition from the high carrier signal 124 to the low carrier signal 126 may be truncated as illustrated at time points (1), (2) and (3). In this example, the low carrier signal 126 is always at a logic low so the modulated signal 128 is the same as in waveform graph (c).

Figure 4:
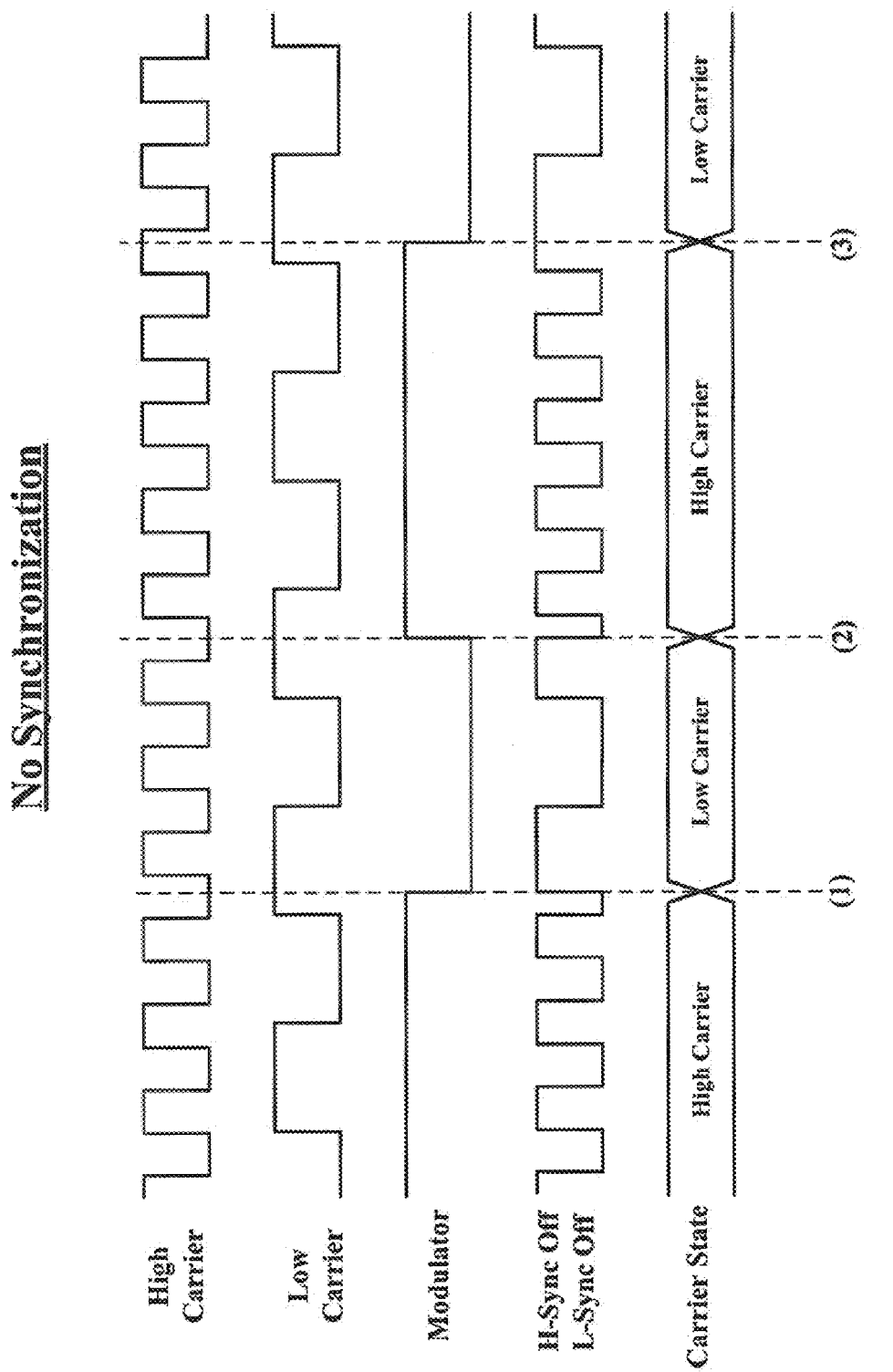
FIG. 4 illustrates a schematic timing diagram of a modulated signal without carrier synchronization when switching between the high and low carriers, according to the teachings of this disclosure.

Referring to FIG. 4, depicted is a schematic timing diagram of a modulated signal without carrier synchronization when switching between the high and low carriers, according to the teachings of this disclosure. When the modulator signal 122 is at a logic high the modulated signal 128 follows the logic states of the high carrier signal 124, and when the modulator signal 122 is at a logic low the modulated signal 128 follows the logic states of the low carrier signal 126. The modulated signal 128 is representative of a FSK or PSK modulated carrier. In the example shown in FIG. 4, the logic state changes of the modulated signal 128 follow the carrier signal selection between the high carrier signal 124 and low carrier signal 126 according to the logic state changes of the modulator signal 122 without regard to the logic states of the high carrier signal 124 and low carrier signal 126. As can be seen at time points (1), (2) and (3), the waveforms of the modulated signal 128 are truncated and are prone to producing "glitches" and frequency spurs.

Figure 5:
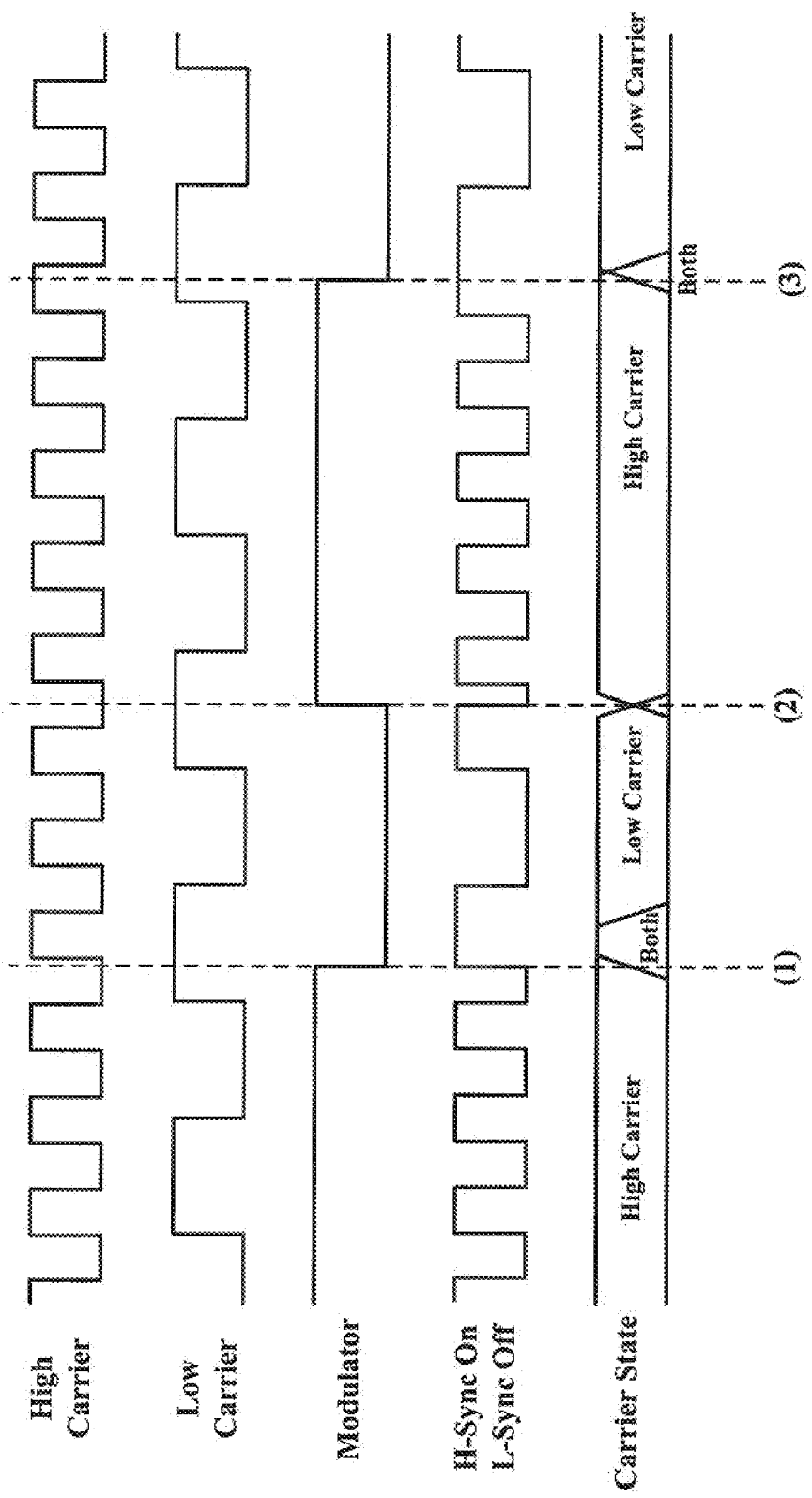
FIG. 5 illustrates a schematic timing diagram of a modulated signal with only high carrier synchronization when switching between the high and low carriers, according to the teachings of this disclosure.

Referring to FIG. 5, depicted is a schematic timing diagram of a modulated signal with only high carrier synchronization when switching between the high and low carriers, according to the teachings of this disclosure. The modulated signal 128 follows the logic states of the high carrier signal 124 so long as the modulator signal 122 is at a logic high. However when the modulator signal 122 goes to a logic low, switching to the low carrier signal 126 to be used as the modulated signal 128 is delayed until the high carrier signal 124 is at a logic low. This prevents some of the glitch problems encountered as shown in FIG. 4. However when the modulator signal 122 goes back to a logic high, the modulated signal 128 will switch back to the high carrier signal 124 irrespective of the logic state of the low carrier signal 126. This still may introduce some undesirable waveforms, e.g., shortening of pulse widths.

Figure 6:
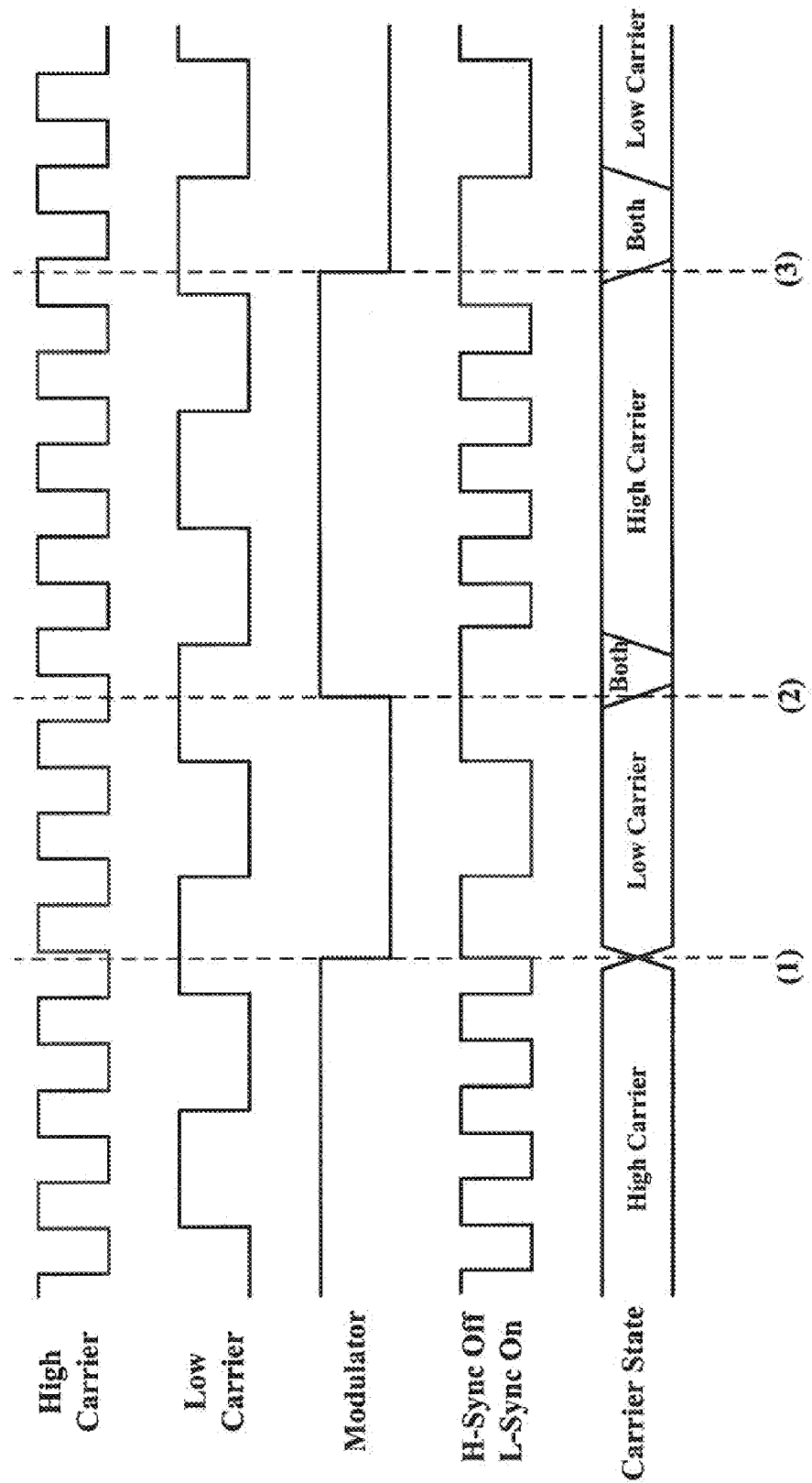
FIG. 6 illustrates a schematic timing diagram of a modulated signal with only low carrier synchronization when switching between the high and low carriers, according to the teachings of this disclosure.

Referring to FIG. 6, depicted is a schematic timing diagram of a modulated signal with only low carrier synchronization when switching between the high and low carriers, according to the teachings of this disclosure. The modulated signal 128 follows the logic states of the low carrier signal 126 so long as the modulator signal 122 is at a logic low. However when the modulator signal 122 goes to a logic high, switching to the high carrier signal 124 to be used as the modulated signal 128 is delayed until the low carrier signal 126 is at a logic low. This prevents some of the glitch problems encountered as shown in FIG. 4. However when the modulator signal 122 goes back to a logic low, the modulated signal 128 will switch back to the low carrier signal 126 irrespective of the logic state of the high carrier signal 124. This still may introduce some undesirable waveforms, e.g., shortening of pulse widths.

Figure 7:
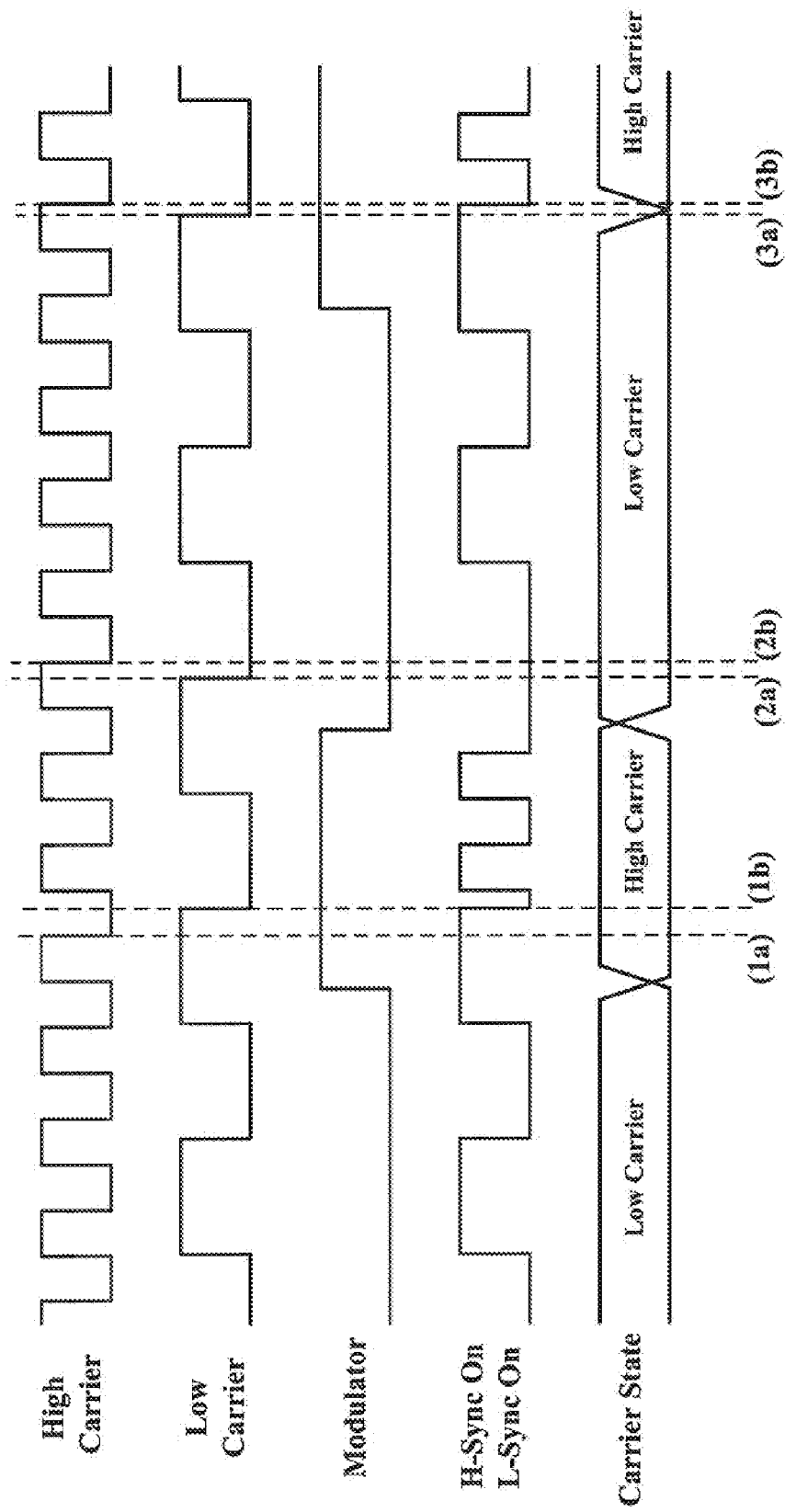
FIG. 7 illustrates a schematic timing diagram of a modulated signal with high and low carrier synchronization when switching between the high and low carriers, according to the teachings of this disclosure.

Referring to FIG. 7, depicted is a schematic timing diagram of a modulated signal with high and low carrier synchronization when switching between the high and low carriers, according to the teachings of this disclosure. The modulated signal 128 follows the logic states of the high carrier signal 124 when the modulator signal 122 is at a logic high and the low carrier signal 126 when as the modulator signal 122 is at a logic low unless the modulator signal 122 is transitioning between logic states, i.e., logic high to logic low or visa versa. The modulated signal 128 will only switch from the high carrier signal 124 to the low carrier signal 126 when the modulator signal 122 is at a logic low and the high carrier signal 124 is at a logic low. Likewise, the modulated signal 128 will only switch from the low carrier signal 126 to the high carrier signal 124 when the modulator signal 122 is at a logic high and the low carrier signal 126 is at a logic low. Synchronizing the modulator signal 122 with both the high carrier signal 124 and the low carrier signal 126 maintains the proper respective waveforms of the modulated signal 128 and substantially reduces glitches therein.

Figure 8:
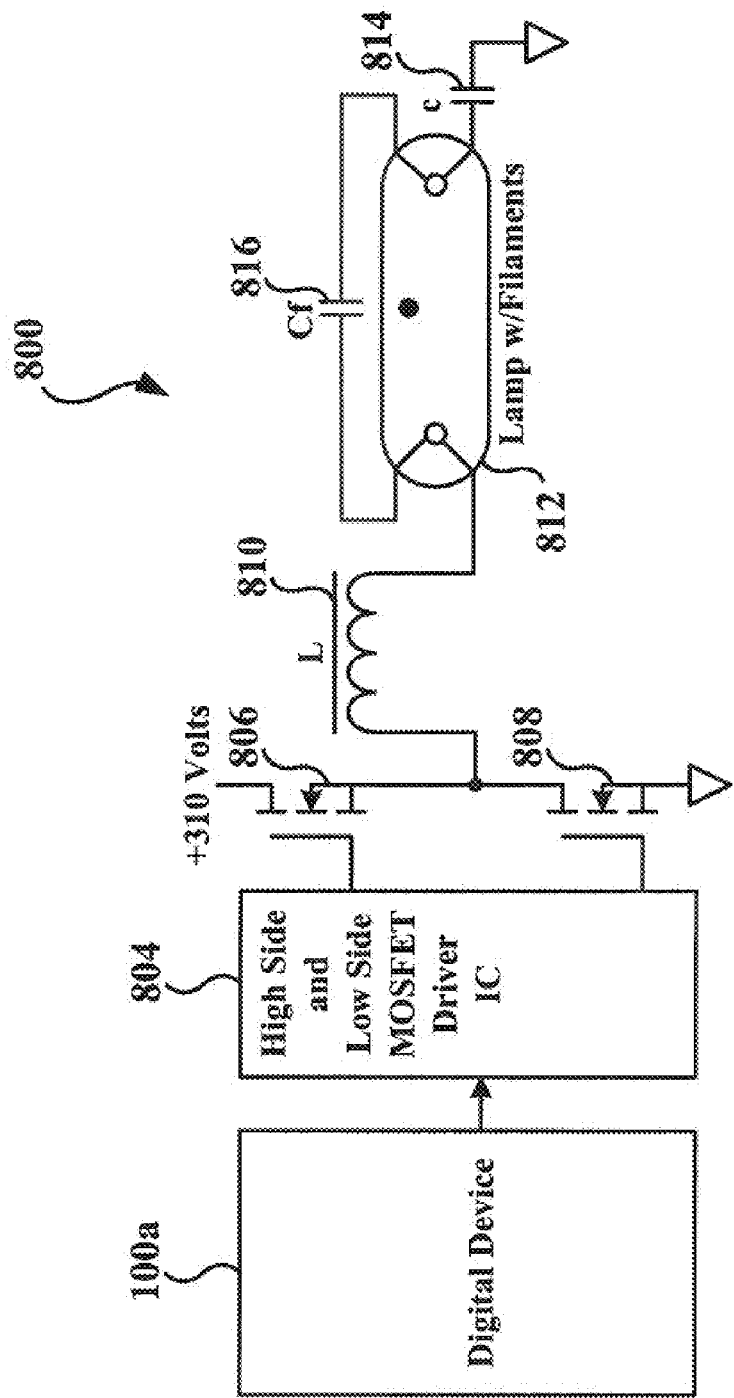
FIG. 8 illustrates a schematic block diagram of a fluorescent lamp driver circuit that utilizes the integrated circuit device of FIG. 1, according to the teachings of this disclosure.

Referring to FIG. 8, depicted is a schematic block diagram of a fluorescent lamp driver circuit that utilizes the integrated circuit device of FIG. 1. The fluorescent lamp circuit of FIG. 8 may be used for both fixed brightness and dimming applications. The fluorescent lamp circuit, generally represented by the numeral 800, comprises an integrated circuit device 100a, high and low side metal oxide semiconductor field effect transistor (MOSFET) drivers 804, a high-side power MOSFET 806, a low-side power MOSFET 808, an inductor 810, a fluorescent lamp 812, a filament capacitor 816, and a DC blocking capacitor 814. The MOSFET drivers 804 are used to translate the low output voltages of the integrated circuit device 100a to the high voltage levels required to operate the high side power MOSFET 806 and the low side power MOSFET 808. The integrated circuit device 100a may be used to switch the high-side driver ON or OFF, and the low-side drive OFF or On, respectively, through the MOSFET drivers 804. When the high-side drive is ON the high-side power MOSFET 806 allows current to flow through the resonant RLC fluorescent lamp circuit (inductor 810 and DC blocking capacitor 814) in one direction, and when the low-side drive is ON the low-side power MOSFET 808 allows current to flow through the resonant RLC fluorescent lamp circuit (inductor 810, fluorescent lamp 812 and DC blocking capacitor 814) in the other direction. The high-side power MOSFET 806 and the low-side power MOSFET 808 cannot be both ON at the same time. Also a dead band is desirable, e.g., the high-side power MOSFET 806 and the low-side power MOSFET 808 are both OFF. This may be easily accomplished with software instructions running in a processor digital of the integrated circuit device 100a. The integrated circuit device 100a may synthesize an alternating current (AC) signal by alternatively turning on the high-side and low-side outputs of the MOSFET drivers 804. For fluorescent lamp dimming applications, careful control of the time duration of the high-side and low-side outputs of the MOSFET drivers 804 will produce an AC drive signal having specific frequencies that may be synthesized as more fully described for the embodiments shown in FIGS. 1 and 2 hereinabove.

The modulator, according to the teachings of this disclosure, may be used in a variety of fluorescent lamp driver systems. For example, but not limited to, multiple frequency pulse density modulation may be effectively used in fluorescent lamp brightness control (dimming) applications. A more detailed description of brightness control using different frequencies temporally for electronic dimming of fluorescent lamps is presented in commonly owned U.S. patent application Ser. No. 11/470,052; filed Sep. 5, 2006; now U.S. Pat. No. 7,642,735, issued Jan. 5, 2010; entitled "Using Pulse Density Modulation for Controlling Dimmable Electronic Lighting Ballasts," by John K. Gulsen and Stephen Bowling; and U.S. patent application Ser. No. 12/631,118; filed Dec. 4, 2009; entitled "Using Pulse Density Modulation for Controlling Dimmable Electronic Lighting Ballasts," by John K. Gulsen and Stephen Bowling; wherein both are hereby incorporated by reference herein for all purposes.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An integrated circuit device having a modulation module comprising:
    a modulation mixer;
    a modulator multiplexer having inputs that receive a plurality of modulator signals and an output connected to a modulator input of the modulation mixer, wherein the modulator multiplexer selects a one of the plurality of modulator signals for coupling to the modulator input;
    a high carrier multiplexer having inputs adapted for coupling to a plurality of carrier signals and an output coupled to a high carrier input of the modulation mixer, wherein the high carrier multiplexer selects which one of the plurality of carrier signals is coupled to the high carrier input;
    a low carrier multiplexer having inputs adapted for coupling to the plurality of carrier signals and an output coupled to a low carrier input of the modulation mixer, wherein the low carrier multiplexer selects which one of the plurality of carrier signals is coupled to the low carrier input; and
    wherein the modulation mixer outputs a modulated signal derived from the high carrier input when the modulator input is at a first logic level and from the low carrier input when the modulator input is at a second logic level.

2. The integrated circuit device according to claim 1, wherein the first logic level is a logic low and the second logic level is a logic high.

3. The integrated circuit device according to claim 1, wherein the first logic level is a logic high and the second logic level is a logic low.

4. The integrated circuit device according to claim 1, wherein a one of the plurality of carrier signals is a no carrier signal continuously at a logic low.

5. The integrated circuit device according to claim 1, wherein a one of the plurality of carrier signals is a no carrier signal continuously at a logic high.

6. The integrated circuit device according to claim 1, further comprising a circuit for synchronizing when the modulated signal is switched from the high carrier input to the low carrier input by only switching when the modulator input and the high carrier input are both at the first logic levels.

7. The integrated circuit device according to claim 1, further comprising a circuit for synchronizing when the modulated signal is switched from the high carrier input to the low carrier input by only switching when the modulator input and the high carrier input are both at the second logic levels.

8. The integrated circuit device according to claim 1, further comprising a circuit for synchronizing when the modulated signal is switched from the high carrier input to the low carrier input by only switching when the modulator input and the high carrier input are both at the same logic levels.

9. The integrated circuit device according to claim 1, further comprising a circuit for synchronizing when the modulated signal is switched from the low carrier input to the high carrier input by only switching when the modulator input and the low carrier input are both at the first logic levels.

10. The integrated circuit device according to claim 1, further comprising a circuit for synchronizing when the modulated signal is switched from the low carrier input to the high carrier input by only switching when the modulator input and the low carrier input are both at the second logic levels.

11. The integrated circuit device according to claim 1, further comprising a circuit for synchronizing when the modulated signal is switched from the low carrier input to the high carrier input by only switching when the modulator input and the low carrier input are both at the same logic levels.

12. The integrated circuit device according to claim 1, further comprising a circuit for synchronizing when the modulated signal is switched between the low carrier input and the high carrier input by only switching to the high carrier input when the modulator input and the low carrier input are both at the first logic levels, and to the low carrier input when the modulator input and the high carrier input are both at the first logic levels.

13. The integrated circuit device according to claim 1, further comprising a circuit for synchronizing when the modulated signal is switched between the low carrier input and the high carrier input by only switching to the high carrier input when the modulator input and the low carrier input are both at the second logic levels, and to the low carrier input when the modulator input and the high carrier input are both at the second logic levels.

14. The integrated circuit device according to claim 1, further comprising a circuit for synchronizing when the modulated signal is switched between the low carrier input and the high carrier input by only switching to the high carrier input when the modulator input and the low carrier input are both at the same logic levels, and to the low carrier input when the modulator input and the high carrier input are both at the same logic levels.

15. The integrated circuit device according to claim 1, further comprising:
a digital processor; and
a memory coupled to the digital processor, wherein the digital processor is controlled with a software program.

16. The integrated circuit device according to claim 15, wherein the modulator multiplexer, the high carrier multiplexer and the low carrier multiplexer are controlled by the digital processor.

17. The integrated circuit device according to claim 15, further comprising modulation control logic for controlling the modulator multiplexer, the high carrier multiplexer and the low carrier multiplexer, wherein the modulation control logic is coupled to the digital processor.

18. The integrated circuit device according to claim 17, wherein the modulation control logic is a logic state machine.

19. The integrated circuit device according to claim 1, wherein the integrated circuit device is a microcontroller.

20. The integrated circuit device according to claim 1, wherein the integrated circuit device is selected from the group consisting of a microprocessor, a digital signal processor (DSP), an application specific integrated circuit (ASIC), a programmable logic array (PLA), and a field-programmable gate array (FPGA).

21. The integrated circuit device according to claim 1, wherein the modulation mixer comprises synchronization logic, wherein the synchronization logic prevents changing from the low carrier input to the high carrier input until the low carrier input is at a logic low, and from the high carrier input to the low carrier input until the high carrier input is at a logic low.

22. The integrated circuit device according to claim 20, wherein
when the synchronization logic is enabled for the high carrier input the modulated signal changes from the low carrier input to the high carrier input only when the high carrier input is at the logic low, and
when the synchronization logic is disabled for the high carrier input the modulated signal changes from the low carrier input to the high carrier input when the modulator input is at the logic high.

23. The integrated circuit device according to claim 20, wherein
when the synchronization logic is enabled for the low carrier input the modulated signal changes from the high carrier input to the low carrier input only when the low carrier input is at the logic low, and
when the synchronization logic is disabled for the low carrier input the modulated signal changes from the high carrier input to the low carrier input when the modulator input is at the logic low.

24. The integrated circuit device according to claim 1, wherein the modulated signal is on-off keying, wherein the high carrier input is at a selected one of the plurality of carrier signals, and the low carrier signal input is at the logic low.

25. The integrated circuit device according to claim 1, wherein the modulated signal is frequency shift keying (FSK), wherein the high carrier input is at a selected one of the plurality of carrier signals, and the low carrier signal input is at another selected one of the plurality of carrier signals.

26. The integrated circuit device according to claim 1, wherein the modulated signal is phase shift keying (PSK), wherein the high carrier input is at a selected one of the plurality of carrier signals, and the low carrier signal input is the selected one of the plurality of carrier signals that is phase shifted.

27. The integrated circuit device according to claim 1, wherein the integrated device is used for dimming a fluorescent lamp.

28. The integrated circuit device according to claim 1, wherein the modulation module is placed into a low power mode when not in use.

* * * * *